United States Patent [19]

Colquhoun

[11] Patent Number: 4,922,310
[45] Date of Patent: May 1, 1990

[54] FIELD-EFFECT TRANSISTOR

[75] Inventor: Alexander Colquhoun, Heilbronn-Frankenbach, Fed. Rep. of Germany

[73] Assignee: Telefunken Electronic GmbH, Heilbronn, Fed. Rep. of Germany

[21] Appl. No.: 914,540

[22] Filed: Oct. 1, 1986

[30] Foreign Application Priority Data

Oct. 1, 1985 [DE] Fed. Rep. of Germany ....... 3535002

[51] Int. Cl.[5] ............................................ H01L 29/80
[52] U.S. Cl. ...................................... 357/22; 357/15; 357/41
[58] Field of Search ...................... 357/23.3, 23.1, 41, 357/15, 23.3, 22 H, 22 I

[56] References Cited

U.S. PATENT DOCUMENTS

| | | | |
|---|---|---|---|
| 4,191,963 | 3/1980 | Schmidt et al. | 357/23 |
| 4,471,366 | 9/1984 | Delagebeaudeuf et al. | 357/16 |
| 4,624,004 | 11/1986 | Calviello | 357/15 |
| 4,740,822 | 4/1988 | Itoh | 357/23.2 |

FOREIGN PATENT DOCUMENTS

| | | |
|---|---|---|
| 0051504 | 9/1981 | European Pat. Off. . |
| 0017531 | 6/1984 | European Pat. Off. . |
| 2036847 | 2/1971 | Fed. Rep. of Germany . |
| 2321895 | 4/1973 | Fed. Rep. of Germany . |
| 2321797 | 1/1981 | Fed. Rep. of Germany . |

OTHER PUBLICATIONS

IEEE Transactions on Electron Devices, vol. ED-24, Jun. 1977, pp. 757-761.
IBM Technical Disclosure Bulletin, vol. 15, #4, Sep. 1972, pp. 1342-1343, by Gaind.
Beneking et al, "Buried–Channel GaAs MESFET's on MBE Material: Scattering Parameters and Intermodulation Signal Distortion", IEEE Transactions on Electron Devices, vol. ED-29, No. 5, May 1982, pp. 811-813.
Mimura et al, "A New Field-Effect Transistor with Selectively Doped GaAs/n-$Al_x$ $Ga_{1-x}$ As Heterojunctions", Japanese Journal of Applied Physics, vol. 19, No. 5, 1980, pp. 225-227.
Yamasaki et al, "GaAs LSI-Directed MESFET's with Self-Aligned Implantation for n+-Layer Technology (SAINT)", IEEE Transactions on Electron Devices, vol. ED-29, No. 11, 1982, pp. 1772-1777.
J. Graffeuil et al, "Semiempirical Expressions for Direct Transconductance and Equivalent Saturated Velocity in Short–Gate–Length MESFETs", IEE Proc., vol. 129, Pt. I, No. 5, Oct. 1982, pp. 185-188.

Primary Examiner—Andrew J. James
Assistant Examiner—Mark Prenty
Attorney, Agent, or Firm—Spencer & Frank

[57] ABSTRACT

The invention relates to a field-effect transistor having a drain region, a source region and a gate electrode for influencing a channel area. The invention consists of arranging the source region and the gate electrode one above the other in a projection onto the channel plane such that the effective length is so small that an increase of the electron velocity in the channel is achieved.

21 Claims, 4 Drawing Sheets

4,922,310

FIELD-EFFECT TRANSISTOR

BACKGROUND OF THE INVENTION

The invention relates to a field-effect transistor having a drain region, a source region and a gate electrode for influencing a channel region.

Field-effect transistors have been studied and developed in recent years, particularly on the basis of compound semiconductor materials having high mobility of the charge carriers, with these components being used particularly in the microwave and millimeter wave ranges.

It is known that the gate length $L_g$ substantially influences the high-frequency characteristics, the cut-off frequency and the noise behaviour of the field-effect transistor. In known field-effect transistors, the width of the gate electrode between source and drain is designated as the gate length.

Considerable effort has already been devoted to reducing the gate length by technological measures and thereby improving the high-frequency behaviour of the components. Reduction of the gate length is possible by improving the resolution of the structures, for example by electron-beam lithography. With conventional optical standard lithography, it has to date only been possible by the use of expensive technological measures to achieve a structural definition sufficient to operate field-effect transistors in the millimeter wave range at frequencies exceeding 30 GHz.

SUMMARY OF INVENTION

The object underlying the present invention is therefore to provide a field-effect transistor whose effective channel length is small enough to be able to operate the transistors in the stated high-frequency range. For this purpose, the field-effect transistor should be able to be manufactured with simple means, working with standard technologies. This objective is attained in accordance with the invention by arranging the source region and the gate electrode above each other in projection onto the plane of the channel region, in a junction field-effect transistor of the type mentioned at the outset, in such a way that the effective channel length is small enough to achieve an increase in the electron velocity in the channel.

From the periodical IEE-Proc.—1, 129, 5, pp. 185–187 of October 1982, it is known that the saturation velocity of the electrons in the active channel greatly increases for extremely short channel lengths. This correlation is illustrated in FIG. 4.

In accordance with the invention, effective channel lengths are now achieved which are within the range shown in FIG. 4 of less than 1 μm, in which range an increase in the saturation velocity of the electrons in the channel takes place. The channel length will preferably be less than 0.5 μm. According to the invention, the channel length given by the gate electrode can be greater, thanks to the arrangement of the gate electrode and the source region one above the other, than the effective channel length that is electrically active. According to the invention, any effective channel length between 0 and 1 μm, can be obtained with the required value of the channel length only fluctuating by the alignment accuracy of the technology used. With standard technologies, alignment accuracies of <0.1 μm are already possible, so that the precision given thereby permits effective channel lengths of between 0 and 1 μm to be achieved.

With the invention, the gate electrode can slightly overlap the source region in the projection on the channel plane in the direction of the drain region. It is, however, also possible for the gate electrode edge facing the drain region to coincide with the source region edge facing the drain region in the projection on the channel plane. This provides a field-effect transistor with extremely high cut-off frequency, with the effective channel length being given by the extension of the depletion layer beyond the edge of the source region in the direction of the drain region. Due to this extension of the space-charge zone in the direction of the drain region, it is even possible to arrange the gate electrode edge facing the drain region a dimension x further away from the drain region, in the projection on the channel plane, than the outer edge of the source region itself. This dimension x can, however, only be so large that, in the operating state of the transistor, the pinch-off area in the channel lies between the outside edge of the source region in the direction of the drain region and the drain. This distance then represents the effective channel length.

Further embodiments features of the invention are described below. The invention and its advantageous embodiments and features will now be described in greater detail, with reference to FIGS. 1 to 8.

BRIEF DSCRIPTION OF THE DRAWINGS

DESCRIPTION OF THE PREFERRED EMBODIMENTS

Figure 1:
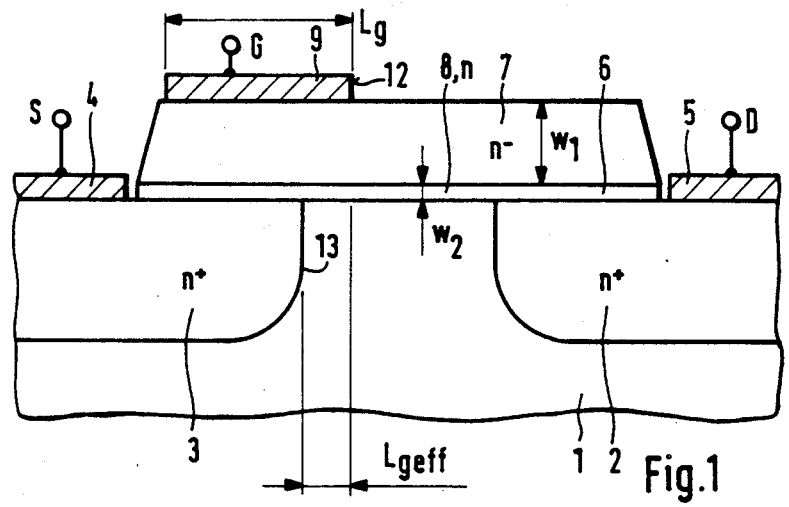
FIG. 1 shows a cross-section through a field-effect transistor constructed in accordance with the invention.

In the field-effect transistor shown in cross-section in FIG. 1, two highly doped $n^+$-conductive zones 2 and 3 are formed as the drain region and the source region, in a highly resistive basis element 1, of, for example, gallium arsenide. These region 2 and 3 can be fabricated by ion implantation, for example, and form contact zones with a depth of 0.5 μm or more, for example. Ohmic contacts 4 and 5 are provided as source and drain electrodes, respectively on these zones 3 and 2 in the outer edge area. A highly doped semiconductor layer 6 is arranged on the semiconductor array, with layer 6 being, for example, 0.05 μm to 0.2 μm thick and extending over the source region 3 and the drain region 2, thereby providing an ohmic connection between these contact areas regions. The portion of layer 6 between source region 3 and drain region 2 forms the channel area 8, which can be pinched off.

This n-conductive layer 6 in the embodiment is made by epitaxy, for example. A weakly n⁻-doped zone or layer 7 is preferably provided thereon, and, finally, gate electrode 9 is arranged on the outer surface of the zone 7. In the embodiment, gate eletrode 9 forms, in conjunction with semiconductor layer 7, a Schottky contact. Semiconductor layer 7 also is preferably made by epitaxy. During the fabrication of the semiconductor device, epitaxial layers 6 and 7 can initially cover the entire surface of the semiconductor basic elements, with contact openings then being provided in these epitaxial layers above regions 2 and 3, and ohmic contacts 4 and 5 being arranged in the said openings. The weakly doped, n⁻-conductive layer 7 has a thickness of preferably 0.1 to 0.5 μm.

Figure 2:
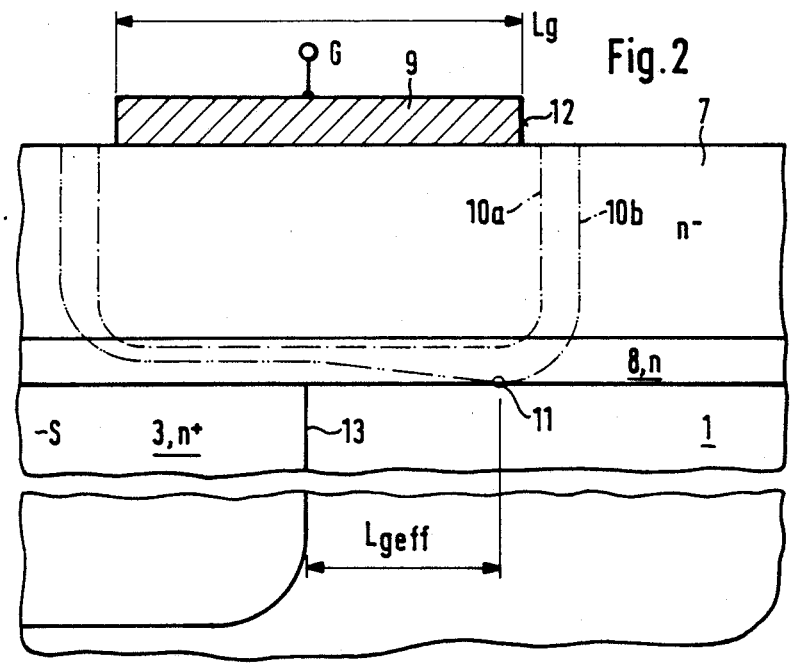
FIG. 2 shows the field-effect transistor in magnified form in the critical area of the channel

As is clear from FIG. 1, gate electrode 9 slightly overlaps edge 13 of source region 3 facing the drain region in a projection onto the channel plane in the illustrated embodiment. This overlap forms the effective channel length $L_{geff}$ since the pinch-off point 11 of the channel through space-charge zone 10a or 10b in accordance with FIG. 2 is largely defined by this overlap. The following applies for the cut-off frequency of a conventional field-effect transistor:

$$f_T = \frac{1}{2\pi} \cdot \frac{g_m}{C_{gs}} \quad (1)$$

where $f_T$ is the cut-off frequency, $g_m$ is the internal forward transconductance of the component and $C_{gs}$ is the gate-source capacitance. By insertion of the weakly doped n⁻-conductive layer 7, the cut-off frequency $f_T$ is not increased, since the following applies:

$$g_m = \frac{\epsilon_0 \cdot \epsilon_r \cdot z \cdot V_s}{w} \quad (2)$$

$$C_{gs} = \frac{\epsilon_0 \cdot \epsilon_r \cdot L_g \cdot z}{w} \quad (3)$$

where W is the penetration depth of the depletion layer, z is the gate width and $V_s$ is the saturation velocity of the electrons in the active channel. $L_g$ is the gate length. When equations (2) and (3) are substituted in equation (1), W is eliminated, so that $f_T$ is independent of W.

Figure 3:
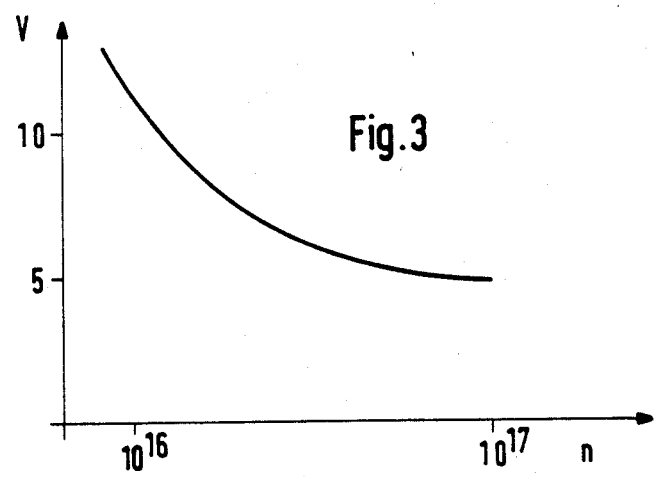
FIG. 3 shows the correlation between the breakdown voltage and doping of the weakly doped semiconductor layer above the channel.

On the other hand, the weakly doped layer 7 effects, in the arrangement according to FIG. 1, an increase in the breakdown voltage of the Schottky contact. The insertion of the weakly doped layer 7 is, for that reason, always useful when a relatively high breakdown voltage V is desired. The relationship between the breakdown voltage and the impurity concentration in semiconductor layer 7 is shown in FIG. 3, which shows that the breakdown voltage increases as the impurity concentration decreases. FIG. 3 illustrated the specific case of the n⁻-conductive layer 7 just being depleted with the built-in potential of the Schottky contact. The weakly doped layer 7 is not absolutely essential. If low breakdwon voltages are permissible, the n⁻-conductive layer can be omitted.

Figure 4:
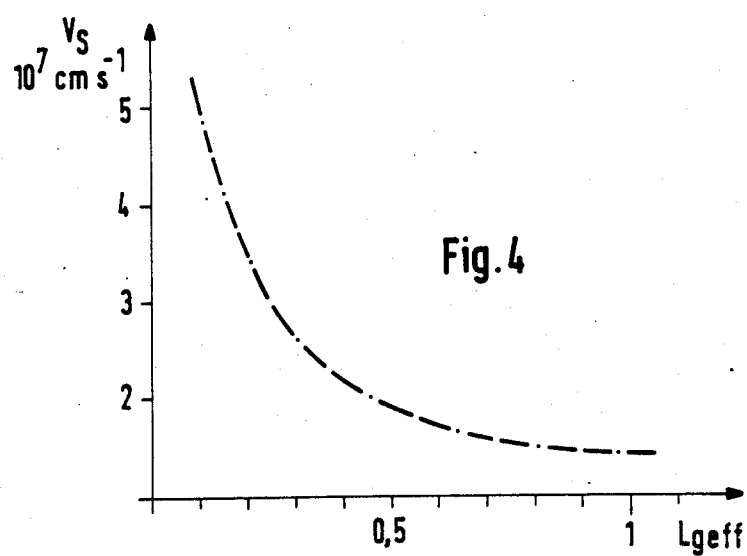
FIG. 4 illustrates the already mentioned correlation between electron velocity and effective channel length.

As can be seen in equation (2), the internal forward transconductance $g_m$ is dependent on the drift velocity $V_s$ of the electrons in the channel, so that the cut-off frequency $f_T$ according to equation (1) rises when the drift velocity $V_s$ rises with decreasing effective channel length according to FIG. 4. When, therefore, the effective channel length $L_{geff}$ according to FIG. 2 drops below 1 μm and preferably below 0.5 μm, the result is an increase of the cut-off frequency $f_T$ to such an extent that the semiconductor device can be used in the microwave range and in the millimeter wave range. In addition, extremely low noise factors are obtained using the configuration as shown in FIGS. 1 and 2. The following applies:

$$F_{min} = 10 \, \text{Log} \, [1 + K \cdot f \cdot L_g \sqrt{g_m (R_s + R_g)}] \quad (5)$$

where $F_{min}$ is the minimum noise figure, K is a material factor for the channel area, f is the frequency in GHz, $L_g$ is the gate length and $R_g$ and $R_s$ are the gate and source resistances of the component.

In the configuration according to the invention, the source resistance is reduced because the source region 3 extends underneath the gate electrode. The gate resistance itself is also reduced, since the gate length $L_g$, i.e. the actual length of the Schottky contact 9, can be selected to be larger than the effective channel length $L_{geff}$.

Figure 5:
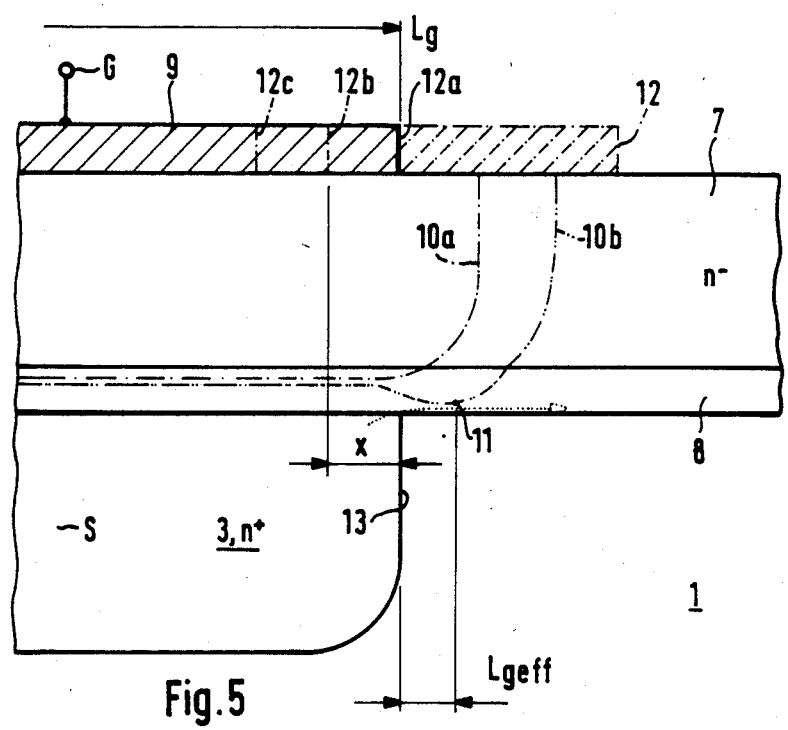
FIG. 5 shows in magnified section the various possible correlations between the extension of the gate electrode and the position of the source region below it.

FIG. 5 shows how the outer edge 12 of the gate electrode can be arranged in relation to the outer edge 13 of the source region 3 facing the drain region. In the hatched version of the gate electrode, the already described overlap between gate electrode and source region 7 is present. In the case of the gate electrode ending at edge 12a, this edge 12a is congruent with the outside edge 13 of the source region. In the embodiments represented by gate edges 12b and 12c, there is even an "underlap" between gate electrode 9 and the source region by a value x. This underlap is possible because the space-charge zone extends, as illustrated, into channel area 8 in the direction of the drain region, so that the underlap x can be selected large enough for the pinch-off area 11 to be just into the channel 8 between the source region 3 and the drain region 2. The distance of the pinch-off area 11 from the outside edge 13 of the source region 3 then forms the effective channel length of the field-effect transistor.

In the embodiment described, the charge carrier concentration in the weakly doped layer 7 is preferably $10^{16}$ to $10^{17}$ charge carriers/cm³, in channels 6 and 8 preferably $10^{17}$ to $10^{18}$ charge carriers/cm³, and in the strongly doped regions 2 and 3 the impurity concentration is preferably higher than $10^{18}$ charge carriers/cm³. Since a weakly doped zone 7 is arranged above the channel zone, the channel itself can be relatively highly doped. This has the advantage that the amplification properties of the field-effect transistor are improved with increasing concentration in the channel zone.

The field-effect transistors in accordance with the invention are preferably made with the aid of epitaxy processes, with these processes giving a high degree of uniformity and perfect interfaces between the various grown layers. This can be achieved by, for example, the organo-metallic, chemical vapour epitaxy process or by molecular beam epitaxy. The weakly doped or undoped semi-insulating substrate 1 can also be replaced by an epitaxially grown intermediate layer, in which the source region 3 and the drain region 2 are then inserted by ion implantation. In this way, deep impurities in the interface between the channel zone and the basic material can be avoided.

Figure 6:
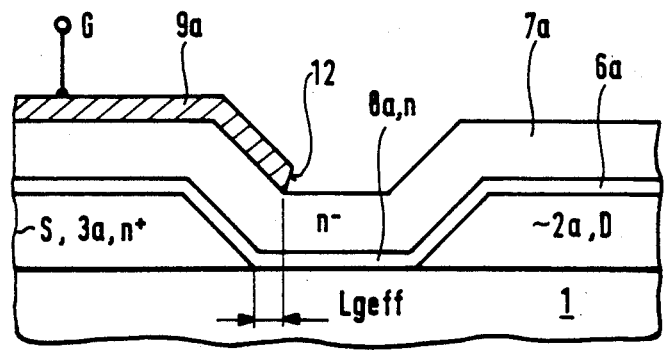
FIG. 6 shows a field-effect transistor fabricated in accordance with the invention using a different technology.

The structure according to FIG. 1 can be replaced by a structure according to FIG. 6. In the embodiment of FIG. 6, the source region 3a and drain region 2a are part of a layer formed on semiconductor element 1 whose center region is removed. The n-doped layer 6a is provided on the structured layer, thus forming channel 8a or the surface portion of substrate 1 between drain region 2a and source region 3a. Layer 6a is finally covered with the epitaxially applied and very weakly doped layer 7a, and finally gate electrode 9a is applied to this weakly doped layer 7a in such a way that a slight overlap results between edge 12 of the gate electrode and the inside edge of source region 3a, so defining the effective gate length $L_{geff}$.

In the described field-effect transistors, the source-/drain current never flows directly on the surface of the component; the active part of the transistor is instead spaced far enough from the semiconductor surface for material faults occurring in the surface area not to influence the electrical characteristics of the field-effect transistor, according to the invention considerably.

Figure 7:
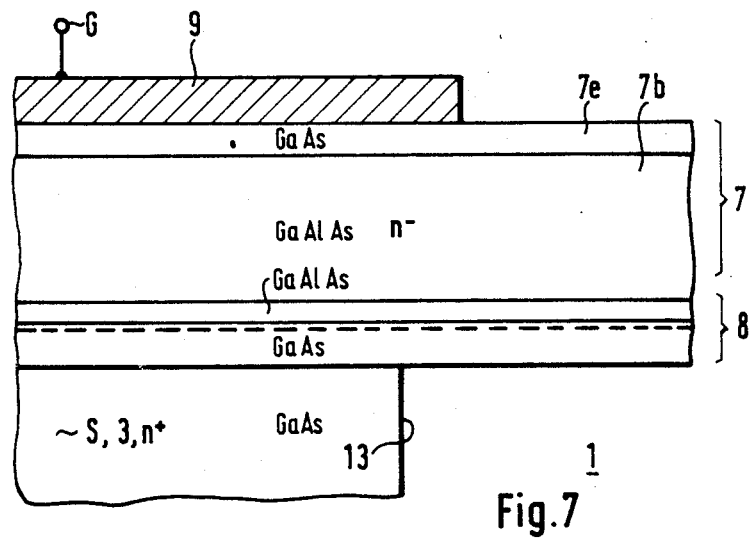
FIG. 7 shows the field-effect transistor with a two-dimensional electron gas instead of the channel.

The active channel in the previously described arrangements can also be replaced by a conductive two dimensional electron gas in accordance with FIG. 7. These structures are often designated HEMT, MODFET of TEGFET structures, and are known, for example, from the periodical "Jap. J. Appl. Physics, Vol. 19, No. 5, 1980, p. 225–227". The channel zone is defined in a structure of this nature by the interface of a heterojunction between a GaAs and a GaAlAs layer. The highly resistive layer 7 results from a weakly doped gallium aluminium arsenide layer 7b and a gallium arsenide contact layer 7e arranged thereon. Other structures for generating the two-dimensional conductive electron gas are also possible.

Figure 8:
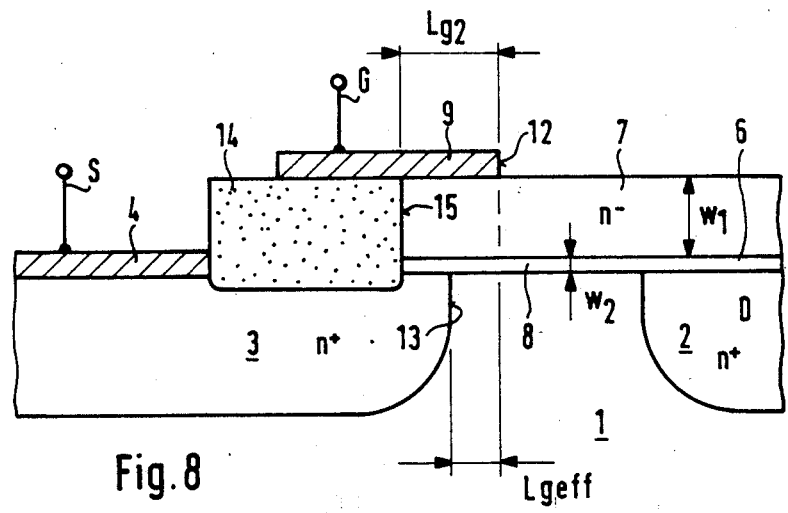
FIG. 8 shows how the capacitive behaviour of the arrangement can be further improved by insertion of an insulating area between gate electrode and source region.

FIG. 8 then shows how the capacitive properties of the field-effect transistor can be further improved. For this purpose, a region 14 between gate electrode 9 and source region 3 is formed from insulating material 14. The part of the electrode facing away from drain region 2 then extends over this insulating material. The insulating region 14 can also be generated by ion implantation by implanting boron or oxygen, for example, into semiconductor layers 6 and 7 until the implantation area assumes insulating characteristics. Another possibility is to partially deposit silicon dioxide or silicon nitride in previously generated insulating windows and then arrange the gate electrode 9 so that it extends from the insulating zone 14 over the weakly doped semiconductor layer 7.

The capacitance of the insulated area 14 underneath the gate electrode is reduced in this way so that the gate capacitance is substantially only determined by the distance between the inside edge 15 of the insulating area 14 and the inside edge 12 of the gate electrode. This part of the gate length is designated $L_{g2}$. The other parts of the field-effect transistor shown in FIG. 8 correspond to the parts already described in connection with previous Figures.

What is claimed is:

1. In a Schottky-gate field-effect transistor having spaced highly doped drain and source regions of one conductivity type located in a common plane at a surface of a highly resistive substrate, a doped semiconductor layer of said one conductivity type disposed on said surface between said source and drain regions and at least partially extending over said drain and said source regions to form a conductive channel region extending between and connecting said drain and source regions, coplanar drain and source electrodes for said drain and source regions respectively disposed on said common plane, and a Schottky-gate electrode for influencing said channel region to provide pinch-off, arranged on said doped semiconductor layer and at most only partially overlapping the channel region between said drain and source regions; the improvement wherein said source region and said gate electrode are arranged one above the other such that, when projected onto the plane of said channel region, any overlap in the direction of said drain region of the outside edge of said source region facing said drain region by the edge of said gate electrode facing said drain electrode is less than 1 μm, whereby a small effective channel length ($L_{geff}$) from said outside edge of said source region in the direction of said drain region is achieved.

2. A field effect transistor according to claim 1 wherein: said source and drain regions are first and second spaced portions respectively of a highly doped first semiconductor layer of said one conductivity type formed on said surface of said highly resistive substrate; and said doped semiconductor layer is a second semiconductor layer of the same conductivity type which covers said spaced portions and the portion of said surface of said substrate between said spaced portions of said highly doped layer.

3. A field effect transistor according to claim 2 wherein a third semiconductor layer of the same conductivity type as said second semiconductor layer, but more weakly doped, is disposed between said second semiconductor layer and said gate electrode and is contacted by said gate electrode.

4. A field-effect transistor according to claim 1 wherein said edge of said gate electrode overlaps said edge of said source region in the direction of said drain region in the projection onto the channel plane.

5. A field-effect transistor according to claim 1 wherein said edge of the gate electrode facing the drain region is congruent with said outside edge of the source region facing the drain region in the projection onto the channel plane.

6. A field-effect transistor according to claim 1 wherein said edge of the gate electrode facing the drain region is further away from the drain region than said outside edge of the source region by the distance x in the projection onto the channel plane, with x only being large enough for the pinch-off area in the channel to be, in the operating state of the transistor, at said distance ($L_{geff}$) from said outside edge of the source region in the direction of said drain region.

7. A field-effect transistor according to claim 1, wherein said effective channel length ($L_{geff}$) is selected between 0 and 1 μm and the accuracy of the length of the channel is given by the alignment accuracy of the technological manufacturing method.

8. A field-effect transistor according to claim 1 wherein said source region and said drain region are highly doped zones of said one conductivity type formed in said surface of said highly resistive semiconductor substrate.

9. A field-effect transistor according to claim 8, wherein a further doped layer of the same conductivity type as said layer forming the channel, but more weakly doped, is arranged between said gate electrode and said doped layer forming the channel.

10. A field-effect transistor according to claim 8, wherein the doped layer forming the channel is approx.

0.05–0.2 μm and the more weakly doped layer above it of the same conductivity type is approx. 0.1–0.5 μm thick.

11. A field-effect transistor according to claim 8, wherein said drain and source regions comprise highly doped zones implanted in said semiconductor substrate.

12. A field-effect transistor according to claim 8, wherein said conductive channel comprises a two-dimensional electron gas.

13. A field-effect transistor according to claim 1, wherein an insulating zone is arranged between the gate electrode and the source region at the end facing away from the drain region.

14. A field-effect transistor according to claim 9 wherein: an insulating zone is arranged between said gate electrode and said source region at the end facing away from said drain region; said insulating zone is generated by ion implantation into said doped and further doped layers; and the space between the outside edge of the insulating zone and the adjacent said edge of the source region facing the drain region is kept as small as possible, while the insulating zone overlaps the edge of the gate electrode facing away from the drain region.

15. A field-effect transistor according to claim 1, wherein III/V compound material, in particular GaAs, is used as the semiconductor material for said transistor.

16. A junction field-effect transistor as defined in claim 2 wherein said gate electrode is arranged over only a part of said source region.

17. In a junction field-effect transistor having spaced drain and source regions located in a common plane, a channel region extending between and connecting said drain and source regions, and a gate electrode for influencing said channel region to provide pinch-off and at most only partially overlapping the region between said drain and source regions; the improvement wherein said source region and said gate electrode are arranged one above the other such that, when projected onto the plane of said channel region, the edge of the gate electrode facing the drain region is congruent with the outside edge of the source region facing the drain region in the projection onto the channel plane, whereby a small effective channel length ($L_{geff}$) from said outside edge of said source region in the direction of said drain region is achieved.

18. In a junction field-effect transistor having spaced drain and source regions located in a common plane, a channel region extending between and connecting said drain and source regions, and a gate electrode for influencing said channel region to provide pinch-off and at most only partially overlapping the region between said drain and source regions; the improvement wherein said source region and said gate electrode are arranged one above the other such that, when projected onto the plane of said channel region, the edge of the gate electrode facing the drain region is further away from the drain region than the outside edge of the source region facing the drain region by the distance x in the projection onto the channel plane, with x only being large enough for the pinch-off area in the channel to be, in the operating state of the transistor, at a distance ($L_{geff}$) from said outside edge of the source region in the direction of said drain region, whereby a small effective channel length from said outside edge of said source region in the direction of said drain region is achieved.

19. A field-effect transistor comprising: a high resistance substrate; spaced highly doped source and drain regions of one conductivity type disposed at a surface of said substrate; a doped semiconductor zone of said one conductivity type arranged on said surface of said substrate, said doped semiconductor zone at least partially extending over said source region and said drain region, and forming a channel region between said source region and said drain region; first and second ohmic contacts for said source region and said drain region, respectively; and a Schottky-gate electrode arranged on said doped semiconductor zone and at least partially covering said source region; and wherein the edge of said gate electrode facing said drain region is arranged in a region which extends laterally from the outside edge of said source region facing said drain region to a maximum distance of 1 μm in the direction of said drain region, and to a distance x in the opposite direction, with said distance x being such that, under operating conditions of said transistor, the pinch-off region of said channel region remains disposed in said channel region between said source region and said drain region, whereby a small effective channel length ($L_{geff}$) from said outside edge of said source region in the direction of said drain region is achieved.

20. A field effect transistor according to claim 19 wherein said doped semiconductor zone includes first and second doped layers of said one conductivity type with said second layer being more weakly doped than said first layer, being disposed between said first layer and said gate electrode, and being contacted by said gate electrode.

21. A field effect transistor according to claim 20 wherein said first layer has a thickness of approximately 0.05–0.2 μm and said second layer has a thickness of approximately 0.1–0.5 μm.

* * * * *